Figure 1:
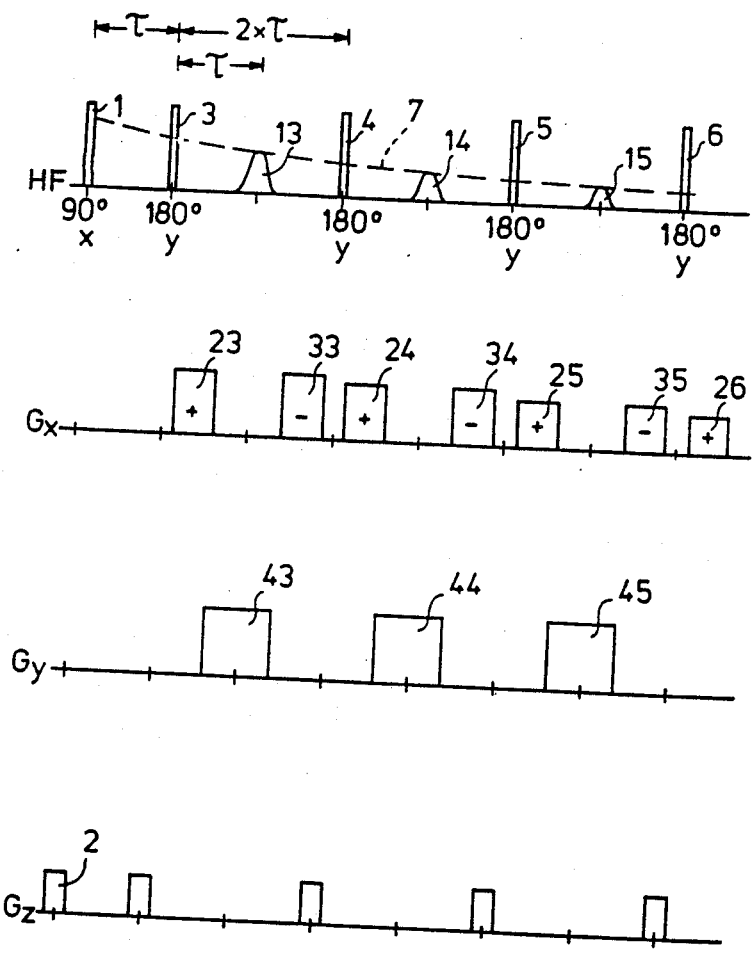

United States Patent [19]

Hennig et al.

[11] Patent Number: 4,818,940
[45] Date of Patent: Apr. 4, 1989

[54] METHOD FOR MEASURING NUCLEAR MAGNETIC RESONANCE

[75] Inventors: Jürgen Hennig, Freiburg; Arno Nauerth, Erlenbach, both of Fed. Rep. of Germany

[73] Assignee: Bruker Medizintechnik GmbH, Rheinstetten-Forchheim, Fed. Rep. of Germany

[21] Appl. No.: 98,637

[22] Filed: Sep. 18, 1987

Related U.S. Application Data

[63] Continuation of Ser. No. 774,569, Sep. 10, 1985, abandoned.

[30] Foreign Application Priority Data

Sep. 18, 1984 [DE] Fed. Rep. of Germany ....... 3434161

[51] Int. Cl.⁴ ............................................. G01R 33/20
[52] U.S. Cl. ...................................... 324/309; 324/307
[58] Field of Search ............... 324/300, 307, 309, 311, 324/312, 313, 314

[56] References Cited

U.S. PATENT DOCUMENTS

| | | | |
|---|---|---|---|
| 4,521,733 | 6/1985 | Bottomley | 324/309 |
| 4,532,474 | 7/1985 | Edelstein | 324/309 |
| 4,595,879 | 6/1986 | Lent et al. | 324/309 |
| 4,609,872 | 9/1986 | O'Donnell | 324/309 X |
| 4,612,504 | 9/1986 | Pelc | 324/309 |
| 4,614,195 | 9/1986 | Bottomley et al. | 324/309 X |
| 4,665,365 | 5/1987 | Glover et al. | 324/309 |
| 4,697,148 | 9/1987 | Strobel et al. | 324/309 |

FOREIGN PATENT DOCUMENTS 0098426 of 0000 European Pat. Off. .

OTHER PUBLICATIONS

Journal of Magnetic Resonance, 56, 179–182 (1984).
Proceedings of the IEEE, vol. 70, No. 10, Oct. 1982. pp. 1152–1173.
Electromedia 52 (1984), No. 2, pp. 56–65.

Primary Examiner—Michael J. Tokar
Attorney, Agent, or Firm—Pennie & Edmonds

[57] ABSTRACT

For recording a nuclear magnetic resonance tomogram according to a Fourier-transform method, a Carr-Purcell-Gill-Meiboom pulse sequence is used for the excitation of a body to produce a sequence of spin-echo signals. A time-limited phase-encoding magnetic gradient field $G_X$ is imposed between each pair of 180° pulses of the sequence. The phase-encoding magnetic gradient field is modified after every 180° pulse so that every spin-echo signal corresponds to a different projection of the body. The magnetic gradient fields used in the recording are regulated in intensity and duration in such a way that a spin-phase condition at each 180° pulse of the pulse sequence remains effectively constant. Thereby, it is possible to construct a complete tomographic recording with a single pulse-sequence excitation, so that the time required for such recordings can be reduced to a fraction of the time needed for recording nuclear-magnetic-resonance tomograms conventionally.

5 Claims, 4 Drawing Sheets

METHOD FOR MEASURING NUCLEAR MAGNETIC RESONANCE

CROSS-REFERENCE TO RELATED APPLICATION

This is a continuation of U.S. application Ser. No. 774,569, filed Sept. 10, 1985, and now abandoned.

The invention concerns a method for measuring nuclear magnetic resonance in selected regions of a body for the purpose of producing body cross sections (NMR tomography). In this process, the body is subjected to a selection gradient outside a homogeneous magnetic field and excited with a 90° pulse. Afterwards, the selection gradient is replaced by temporally defined phase-encoding gradients and recording gradients. Finally, the specimen is exposed to a sequence of 180° pulses, which together with the 90° pulse form a Carr-Purcell-Gill-Meiboom pulse sequence (CPGM sequence). The duration of radiofrequency application and the intensity of the gradient fields are determined by the appearance of the pulse sequence in such a way that the rephasing conditions are satisfied for all gradient fields. In so doing, with every excitation, several nuclear induction signals are produced in the form of so-called spin echos. With regard to modifications of the phase-encoding gradients according to the 2D-FT image construction process, the signals are the mathematically converted into image signals.

This type of method is described in German patent application No. P 34 14 634.2 concerning the state of technology. In this patent application, various possibilities are treated for satisfying rephasing conditions through application of a CPGM sequence. Satisfying the rephasing conditions is a prerequisite for being able to apply this type of CPGM sequence for NMR tomography and especially for the production of images according to the 2D-FT method. Violation of the rephasing conditions results in image-errors. The image-errors precluded the use of such CPGM sequence for NMR tomography extensively until that time. As with conventional NMR spectrography, it is also the case with the method under discussion that the use of CPGM sequences has the goal of obtaining a multitude of similar images, which either can be added up for improving the signal-noise ratio or else produce data on the temporal development of the spin-echos, especially concerning the spin-spin relaxation time $T_2$.

However, the present invention does not deal with either the problem of the signal-noise ratio or an exact $T_2$ determination. The practical application of NMR tomography has suffered until now under the necessity of taking a multitude of single measurements in order to obtain the requisite measured values for image reconstruction. Another difficulty has been the fact that the time required for a single measurement is relatively long, because it includes the relaxation time that must be waited for before every new excitation. In this respect, there appear to be physically determined limits to reducing the measurement.

Nevertheless, it is the underlying task of this invention to achieve a significant reduction of measurement time for NMR tomography.

According to the invention, this problem is solved by changing the intensity and/or duration of the phase-encoding gradient after every 180° pulse.

Using the invention's method, the application of CPGM sequence for the 2D-FT method is not applied to improving the signal-noise ratio by manipulating the multitude of spin-echos by means of an excitation. The application of CPGM sequence for the 2D-FT method is also not applied to making an exact $T_2$ determination. Rather, by means of altering the phase-encoding gradient after every 180° pulse, a multitude of different echo signals are obtained, which are responsible for the image content in a dependency on the phase-encoding gradient in various manners. In this way, it is possible to obtain the echo-signals which are necessary for image-reconstruction as a reaction to only a few excitations and in the limiting case, to only one excitation. The invention's method accordingly results in a reduction of the test times for a fraction of what was necessary up until now. This is extraordinarily important especially for the use of NMR tomography in human medicine.

The 2D-FT image reconstruction method proceeds on the assumption that the signals obtained for each of the single measurements that are to be analyzed have the same amplitude for a prescribed intensity level. This condition is not satisfied in the application of the invention's method, because the signal amplitude decreases with increasing time interval from the excitation owing to the relaxation processes. The result is a certain reduction in the image quality, which is expressed in a background lightening. But especially in the field of medicine, this can easily be tolerated because in that case what matters more is the contrast between tissues with different $T_2$ values. The $T_2$ contrast can, however, be varied by the invention's method by changing the assignment of the different phase-encoding gradients to the successive 180° pulses. In particular, if the echo signals of several excitations are used for reconstruction of the image, then an interlocked assignment of the different values of the phase-encoding gradient can occur for the echo signals assigned to the single excitations, whereby a lightening of the image background is avoided for the most part. Indeed, with the use of the same CPGM sequence, a sort of step-up distance difference occurs relative to the amplitudes of the single echo signals, which gives rise to interfering side-bands. Nevertheless, there is a simple possibility for eliminating gradations and thereby this type of interfering sidebands. This possibility lies in the variation of the time interval between the 90° pulse and the first 180° pulse with every excitation with a fraction of the interval between the 180° pulses inversely proportional to the number of repetitions. In this way, the echo signals caused by the various excitations can be shifted against each other in relation to the excitation time in such a manner that the echo signals are separated proportionately according to the measurement interval defined by an excitation. By doing this, they represent a continuous decrease of the signal amplitude and not the gradation resulting in side-bands.

The invention not only offers the possibility of producing a strengthening of the $T_2$ contrast by means of the ingenious assignment of the different values of the phase-encoding gradients to the temporally successive echo signals, but the invention also allows for the control and particularly the increase of the $T_1$ contrast. This is done by having each new excitation occur with each repeated excitation of the specimen before a complete relaxation has occurred for the spin-moments excited by the preceding CPGM sequence. As a result of this procedure, the spin-moments, which have not yet relaxed owing to the large $T_1$, are not registered by the next excitation and therefore do not produce any signals. The contrast to the regions with short $T_1$ is intensified in which a completed relaxation of the spin-moments has occurred, which at this stage yield a full signal.

The very short measuring time, which is required for the determination of the requisite measurement values for the 2D-FT image-reconstruction method, also offers the possibility of applying the invention with a 3D-FT image-reconstruction method. The special advantage of the image-reconstruction method with 2D-Fourier transformation is that it also produces very good images when the homogeneity of the magnetic field is not very great. This advantage would still be increased significantly with its extension to the three-dimensional volume. The significant reduction of the test time made possible by the invention now permits the extension to three-dimensional space. Accordingly, the invention also is concerned with a method by which another phase-encoding gradient is used as the selection gradient and the image-reconstruction occurs according to the 3D-FT method.

Figure 2:
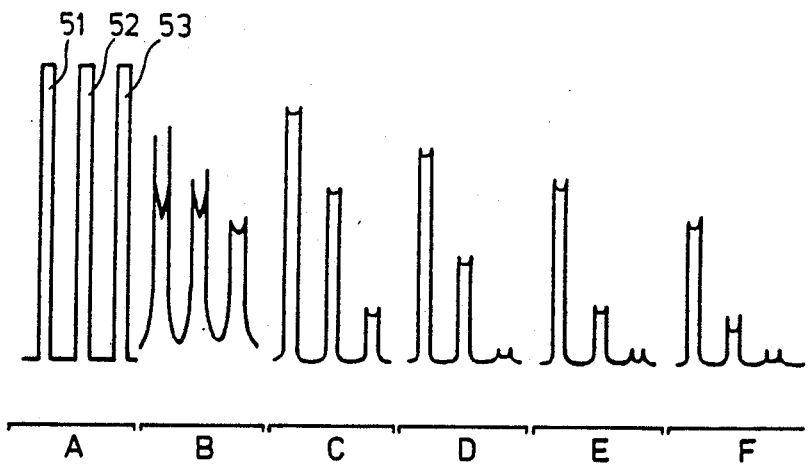
Figure 3:
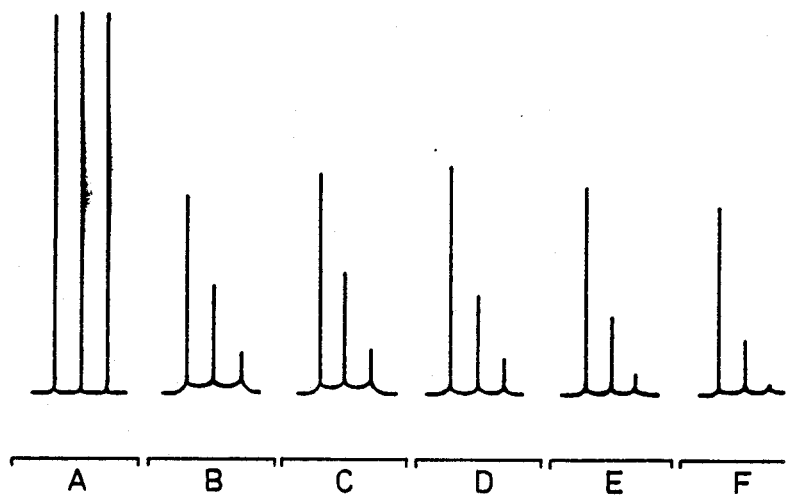
Figure 4:
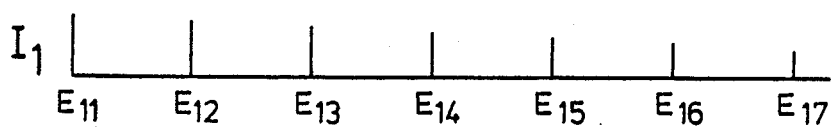
Figure 4:
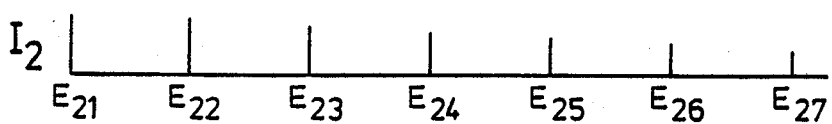
Figure 4:
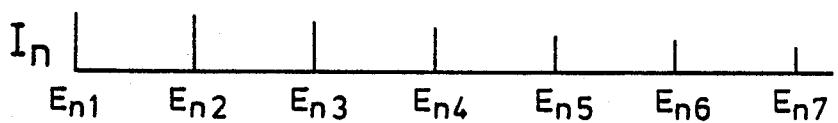
Figure 4:
Figure 4:
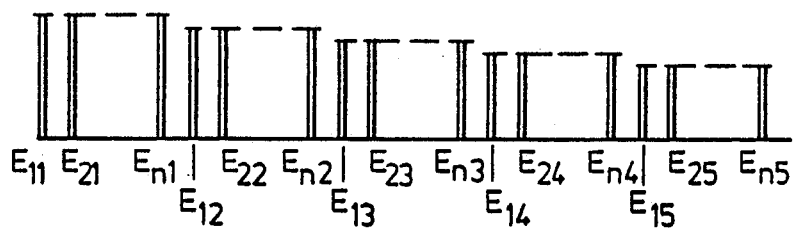
Figure 5:
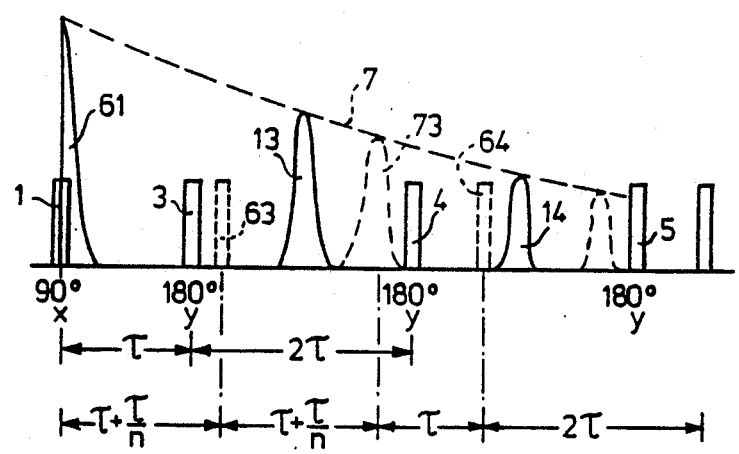

The invention is described in more detail and clarified in the following sections in light of the examples shown in the diagram. The characteristics to be learned from the description and the diagram can find application by other realizations of the invention singly on their own or severally in any combination. Shown are:

FIG. 1 The Time Diagram of a CPGM-Pulse Sequence and of the Gradient Fields, As They Find Use in an Embodiment of the Invention's Method;

FIGS. 2 and 3 Diagrams Which Show the Influence on the Image Contrast of the Assignment of the Different Phase Gradients to the Various Echo Signals;

FIG. 4 A Diagram to Elucidate the Interlocking of Recording Sequences in Relation to the Phase Gradient; and FIG. 5 A Diagram Which Illustrates a Modified CPGM-Sequence for the Avoidance of Image Errors.

The invention's method can be performed on every NMR tomograph whose oscillator is configured to generate HF-pulse sequences and whose magnet arrangement permits the generation of switchable gradient fields, one of which coincides with the direction of the homogeneous magnetic field necessary for the production of NMR spectra. A suitable tomograph, for example, is the applicant's BMT 1100 type whole-body tomograph.

With the invention's method, according to its essence, one is dealing with a 2D-FT method, whereby the body, which is preferably excited selectively in the area of a cross section, is exposed to a time-limited phase-encoding gradient before the switching-on of the recording gradient. The spin-echoes obtained on the basis of the excitation and phase-encoding are subjected to a two-dimensional Fourier transformation, which yields signals assigned to single image points, and the amplitude of the signals is proportional to the intensity of the image points. For every element-of-volume to be analyzed, that is, for every image point, a projection (that is, the generation of a spin-echo) is required after plotting another phase-encoding gradient. Since until now a separate excitation of the specimen was required for the generation of a spin-echo under a particular, assigned phase gradient, a substantial expenditure of time was devoted to the generation of an image according to the 2D-FT process.

Instead of this, with the invention's method, a spin-echo pulse-sequence is used and a modified phase-encoding gradient is established before the generation of each new echo signal, so that every single spin-echo for an echo sequence, which has been generated by one single excitation, is characteristic for a different projection. Of course, there is the prerequisite that in the course of the pulse sequence and of the repeatedly established phase-encoding gradients and recording gradients, no changes occur in the excitation condition of the spin moments, which result in an image adulteration. Therefore, care must be taken that the rephasing requirements are satisfied for the recording gradients and also for the phase-encoding gradients, that is, that the Gill-Meiboom requirement is met for the Carr-Purcell-Gill-Meiboom pulse sequence used.

An example of a pulse- and gradient-field sequence, by which the Gill-Meiboom requirement is satisfied, is shown in FIG. 1. This sequence includes a common CPGM sequence of HF-pulses with an initial 90° pulse 1, by means of which the specimens are excited by the application of a selection gradient $G_z$ selectively in the area of a cross section defined by the selection gradient. In the normal way, the 90° selection pulse 1 is then followed by 180° pulses 3, 4, 5, and 6, which cause a rephasing of the spin moments that were induced by selection pulse 1 and were dephased after the excitation, so that in a known way spin-echos 13, 14, 15 are formed, which appear in the same time interval $\tau$ from the preceding 180° pulse as this 180° pulse has from selection pulse 1, that is, the preceding spin-echo. In the embodiment example presented, all these intervals are the same.

The phase-encoding required for the 2D-FT method is brought about by establishing a phase-encoding gradient $G_x$. And it is true that from time to time, this gradient is switched on in connection to an 180° pulse and ended again before the appearance of the spin-echo. In FIG. 1, the switching-on of the phase-encoding gradient by means of the pulse-like sequence of curves is illustrated. The different height of these curve-paths demonstrates that the phase-encoding gradient has another intensity each time, so that it results in a different phase-encoding. The phase-encodings caused by the different phase-encoding gradients must nevertheless constantly start from the same initial state, if they are supposed to produce results that can be evaluated. Therefore, it is necessary to cancel the effect of every phase-encoding, before a new phase-encoding occurs. With the embodiment example of the invention's method presented, this occurs through constructing the phase-encoding gradient with the same intensity and duration, however, with reverse positive direction, symmetrical to the appearance of the echo-signal, as curves 33, 34, and 35 show. The effect of the reversal of negative phase-encoding gradient 33 on the dephasing spin-moments is exactly as great as the effect of the preceding phase-encoding gradient 23 on the rephasing spin-moments, so that at the time of the 180° pulse 4, exactly the same phase condition prevails as at the time of the preceding 180° pulse 3. Correspondingly, this is valid for the phase-encoding gradients 24, 34, or 25, 36, etc.

Correspondingly, care must also be taken for an arrangement of the recording gradient, 43, 44, 45 symmetrical to the echo-signal, that its influence on the rephasing and the dephasing spin-system is completely the same, so that the influence of the recording gradient is also negated.

The application of selection gradient $G_z$ during the 180° pulses, as it occurs with the method presented, is not necessary if it is a matter of broad-band pulses for the 180° pulses. The invention's method, however, makes possible the establishment of the selection gradient during the 180° pulses, so that frequency-selective pulses can be used here, whereby it can be a matter of pulses of relatively longer duration and lower energy in contrast to broad-band pulses. Also here, by means of a symmetrical arrangement of the selection gradient to the 180° pulses, care is taken that the phase relationship of the spin system is not disturbed.

It is to be understood that the pulse and gradient field system presented is not the only possible one to satisfy the rephasing requirements or the Gill-Meiboom requirement. In U.S. Pat. No. 4,697,148 ("the '148 patent"). The invention's method is not dependent on a certain pulse and gradient field sequence, in as much as care is only taken that the Gill-Meiboom requirement is satisfied. The use of the conventional CPGM sequence and the gradient fields of equal intensity that are arranged symmetrically to it has the advantage that such pulse and field sequences can be generated with especially low effort.

Despite maintaining the rephasing or CPGM requirement, it cannot be avoided that as a consequence of the relaxation processes, the amplitude of spin-echos 13, 14, and 15 decreases corresponding to relaxation curve 7, as shown in FIG. 1. As a result of this, the single points of the image obtained are weighted with the different relaxation functions coordinated with these image points. If the image plotting occurs with M echos per excitation and if P projections or echo signals with different phase-encoding gradient are needed for the generation of an image, in order to reconstruct an image matrix of the size $B \times B = P$, then every echo signal representing a projection $E_{m,p}$ can be understood as the sum of the image elements of the signals originating from the single image elements $S_{x,y}$:

$$E_{m,p} = \nu S_{xy}, \quad (1)$$

where:
m=1; M
p=1; P
x=1; B
y=1; B

Because the amplitude of the signals $S_{x,y}$ originating from the single image elements decreases with the relaxation function $R_{x,y}(t)$ of the pixel, then it is valid that:

$$S_{x,y} = A_{x,y} \cdot R_{x,y}(m \cdot 2\tau) \quad (2)$$

where:
$A_{x,y}$ is the initial value of the signal amplitude, and $\tau$ is the time interval between the 180° pulses of the CPGM sequence Corresponding to this, Equation (1) becomes:

$$E_{m,p} = \Sigma A_{x,y} \cdot R_{x,y}(m \cdot 2\tau) \quad (3)$$

The single echo signals, thus, are weighted with the relaxation-function of the single image points. Correspondingly, the signals which reproduced the intensity of the single image points and which were obtained by the Fourier transformation, are also weighted with the relaxation-function of the pixel. This weighting is dependent on the coordination of the P phase-encoding gradients to the M's of the echo-signals obtained with every excitation. This coordination can be arbitrarily selected, whereby it is possible to vary the image contrast determined by the weighting for different applications.

Next let us consider the case in which the number M of echos per excitation and the number P of projections with different phase-encoding gradient are the same, so that the total image can thus be recorded with a single excitation. Thereby the modification of the phase-encoding gradient can occur in such a way that with the first echo, the dephasing $\phi_{min}$ is present and with the last echo, the dephasing $\phi_{max}$ is present. Thereby, the null point of the phase displacement can be placed at any random point of the echo sequence. FIGS. 2 and 3 present the influence of displacing the phase null point to different locations for structures with different $T_2$ times.

In FIG. 2, bars 51, 52, and 53 represent the signal intensity which results from the spin density of three different regions with different relaxation times $T_2$ directly after the excitation, thus still uninfluenced by relaxation. Region 51 has a long $T_2$; region 52, a medium; and region 53, a short $T_2$.

Fields B to F of FIG. 2 reproduce the intensities of the same regions 51 to 53, as they are shown in field A of FIG. 2, as they arise with application of the invention's method and with displacement of the null points of the phase gradient to the excited echo signals. One obtains the intensities of field B, when the null point of the phase gradient is present at echo No. 32 with a recording of 256 echo signals. Correspondingly, the null point of the phase gradient for the signals of field C lie at echo 64; for the signals of field D, at echo 96; for the signals of field E, at echo 128; and for the signals of field F, at echo 1. It is evident that the absolute height of the signals is changed as well as the relationship of the signals, which are correlated with regions with different $T_2$. A maximal signal is produced in field C with very good contrast. Note the increased signal height at the edges of the regions, which can be traced back to the decrease of amplitude of the echo signals as a result of relaxation. Analogous to FIG. 2, FIG. 3 represents signal intensities which, however, do not relate to regions but rather to single image points.

If the image recording occurs with more than one excitation, then the phase gradient can be distributed among the echo-signals of the various excitations in such a manner, that with the first activation, from $\phi_{min}$ to $\phi_1$, with the next activation from $\phi_1$ to $\phi_2$, and with the last activation, from a value $\phi_n$ to $\phi_{max}$ there is an increase. However, an interlocking can also be presumed, as is shown in FIG. 4 for the echos brought about by excitations $I_1$ to $I_n$. This interlocking, as it is shown in the last line of FIG. 4, is to be understood in relation to a uniformly increasing phase gradient from $\phi_{min}$ to $\phi_{max}$, so that respectively the first echo signals $E_{11}$ to $E_{n1}$ of the various excitations $I_1$ to $I_n$ are assigned to the first consecutive values of the phase gradient, whereupon the second echo signals $E_{12}$ to $E_{n2}$ of the various excitations then follow, etc. Thereby, of course, an amplitude gradation results, which can severely impair the image quality. This gradation can be eliminated, nevertheless, by modification of the excitation process for reciprocal displacement of the echo signals caused by the various excitations in such a way that they all have the same time interval from each other and consequently also have an amplitude following the relaxation curve and constantly decreasing. For this purpose, it suffices to vary with each excitation the time interval between the 90° pulse and the first 180° pulse by a fraction of the interval between the 180° pulses inversely proportional to the number of repetitions.

FIG. 5 again shows the beginning of a CPGM sequence with the echo signals obtained from it. The 90° selection pulse 1 causes an initial induction signal 61, which normally is not evaluated. The dephasing of the signal is then cancelled after a time $\tau$ by the 180° pulse 3, so that it again results in rephasing after a time $\tau$ and therewith the creation of echo signal 13. Additional 180° pulses 4, 5, etc., then follow after this, in relation to the first 180° pulse, in each case in the interval $2\tau$, which produce the corresponding echo signals, of which echo signal 14 is still shown in FIG. 5. The amplitude of the echo signals decreases corresponding to relaxation curve 7. To this extent, FIG. 5 agrees with FIG. 1.

In order to obtain a relative chronological displacement of the echo signals with several excitations, the interval of the 180° pulse from the 90° pulse is lengthened by $\tau/n$ with the next excitation, if n is the number of planned excitations. Consequently, echo signal 73, which is produced by the time-delayed 180° pulse 63, also appears in the interval $\tau+\tau$ from 180° pulse 73 so that in contrast to the first echo signal 13 of the first excitation, it is displaced by the time $2\tau/n$. The next 180° pulse 64 is then produced again in the interval $\tau$ from echo signal 73 so that from now on the pulse and signal interval uses $2\tau$ and the previously accomplished displacement of the echo signals remains held over the entire sequence. FIG. 5 shows the case for $n=3$. With the next excitation, an additional displacement to $\tau/n$ takes place again so that uniform, chronological interlocking is achieved for all echo signals.

In relation to the first echo signal 73, the process elucidated with FIG. 5 can be considered as an advancement of the excitation time at $2\tau/n$ instead of the lengthening of times described between the 90° pulse and the first 180° pulse with the corresponding lengthening of the time between the first 180° pulse and the first echo, respectively, at $\tau/n$. The 90° pulse could also be followed already after the time $\tau/n$ by a 180° pulse, which results in the generation of an echo signal after an additional time $\tau/n$. Therewith, a rephasing condition is achieved shifted by $2\tau/n$ opposite the 90° pulse. Further 180° pulses can then be related to the rephasing condition, so that the next 180° pulse is then displaced by $2\tau/n$ opposite to the 180° pulses of the first sequence. The same result could also be achieved by obtaining the excitation produced by the 90° pulse by means of a spin-locking pulse of duration $2\tau/n$. The use of the described methods leads again to an echo multiplied by the relaxation function, as it was explained above. Of course, the dwell-time for the 2D-Fourier transformation appears shortened by the factor $1/n$, which results in a decrease of the $T_2$ contrast of the image, because pixels are now also still presented with short $T_2$ times.

The invention is not limited to the described realization of the invention's method. On the one hand, the high recording speed makes it possible to extend the method also to a 3D-FT method, by which a selection gradient is used in the form of another phase-encoding gradient, for which the same criteria are valid for the phase-encoding gradient $G_x$ discussed above. In applying the phase-encoding gradient $G_x$, care must be taken that the rephasing requirements are met, that is, thus, the Gill-Meiboom requirement. In addition, the possibility exists of producing yet another $T_1$ contrast in the image by means of a variation of the repetition rate between the single excitations. If the excitation interval is selected so short that spins with large $T_1$ have not yet relaxed, then these spins are not registered with the next excitation and therefore also cannot produce a signal. From this, a significant intensity difference is created between regions with large and small $T_1$.

We claim:

1. A nuclear-magnetic-resonance Fourier-transform tomographic method for imaging cross sections of a body, the method comprising exposing the body to a homogeneous magnetic field, superimposing upon the body a time-limited selection magnetic gradient field, during the selection magnetic gradient field irradiating the body with an essentially 90° pulse, subsequently irradiating the body with a timed sequence of essentially 180° pulses to produce a sequence of spin-echo nuclear induction signals, the relative phases and spacing of the 90° pulse and the 180° pulses being selected to define a Carr-Purcell-Gill-Meiboom pulse sequence so that a spin-echo nuclear induction signal occurs in an interval between each pair of adjacent essentially 180° pulses in the pulse sequence, during the sequence of essentially 180° pulses superimposing upon the body a sequence of time-limited phase-encoding magnetic gradient fields and time-limited recording magnetic gradient fields, each phase-encoding magnetic gradient field being imposed during a time interval between a pair of adjacent essentially 180° pulses of the Carr-Purcell-Gill-Meiboom pulse sequence, a portion of the phase-encoding magnetic gradient field being imposed between the first essentially 180° pulse of the pair of pulses and a midpoint of the spin-echo nuclear induction signal occurring between the pair of pulses, each recording magnetic gradient field being imposed during the time interval between a pair of adjacent essentially 180° pulses of the Carr-Purcell-Gill-Meiboom pulse sequence coincident with the occurrence of the spin-echo nuclear induction signal between the pair of pulses, the phase-encoding magnetic gradient fields being changed after each essentially 180° pulse in accordance with a Fourier-transform tomographic imaging method, the form and timing of each time-limited magnetic gradient field relative to the substantially 180° pulses and the spin-echo nuclear induction signals being selected so that spin dephasing which arises during the magnetic gradient field is substantially cancelled at the end of the time-limited gradient field so that a spin phase condition at the time of each essentially 180° pulse subsequent to the first such pulse is substantially the same as a spin phase condition at the time of the preceding essentially 180° pulse, sampling and digitizing the spin-echo nuclear induction signals to form digitized nuclear signal data, and combining such digitized nuclear signal data in accordance with the Fourier-transform tomographic method to form a tomographic image of the cross section of the body.

2. Method according to claim 1, characterized by the body being excited repeatedly in succession with Carr-Purcell-Gill-Meiboom sequences and being subject to different phase-encoding magnetic gradient fields with the successive excitations.

3. Method according to claim 2, characterized by the time interval between the 90° pulse and the first 180° pulse as well as between the first two 180° pulses being increased with every excitation by a fraction of the constant interval between the remaining 180° pulses inversely proportionate to the planned number of repetitions.

4. Method according to claim 2, characterized by each repeated excitation occurring before a complete relaxation of the spin-moments excited by the preceding Carr-Purcell-Gill-Meiboom sequence has taken place.

5. Method according to claim 1 characterized by another phase-encoding magnetic gradient field being used as a selection magnetic gradient field and the image reconstruction occurring according to a three-dimensional nuclear-magnetic-resonance Fourier-transform tomographic method.

* * * * *